United States Patent
Kwok

(10) Patent No.: US 9,621,187 B2
(45) Date of Patent: *Apr. 11, 2017

(54) PROCESSING ELEMENTARY CHECK NODES OF AN ITERATIVE DECODER

(75) Inventor: Zion S. Kwok, Burnaby (CA)

(73) Assignee: Intel Corporation, Santa Clara, CA (US)

( * ) Notice: Subject to any disclaimer, the term of this patent is extended or adjusted under 35 U.S.C. 154(b) by 719 days.

This patent is subject to a terminal disclaimer.

(21) Appl. No.: 13/996,532

(22) PCT Filed: Mar. 28, 2012

(86) PCT No.: PCT/US2012/031031
§ 371 (c)(1),
(2), (4) Date: Jun. 20, 2013

(87) PCT Pub. No.: WO2013/147774
PCT Pub. Date: Oct. 3, 2013

(65) Prior Publication Data
US 2013/0346833 A1    Dec. 26, 2013

(51) Int. Cl.
*H03M 13/00* (2006.01)
*H03M 13/09* (2006.01)
*H03M 13/11* (2006.01)

(52) U.S. Cl.
CPC ........ *H03M 13/09* (2013.01); *H03M 13/1117* (2013.01); *H03M 13/1171* (2013.01)

(58) Field of Classification Search
CPC ...... H03M 13/00; H03M 13/03; H03M 13/09; H03M 13/091; H03M 13/1111;
(Continued)

(56) References Cited

U.S. PATENT DOCUMENTS

| 6,594,318 B1 * | 7/2003 | Sindhushayana . H03M 13/2957 375/262 |
| 7,143,336 B1 | 11/2006 | Moon et al. |

(Continued)

FOREIGN PATENT DOCUMENTS

| CN | 101106380 A | 1/2008 |
| CN | 102111241 A | 6/2011 |
| CN | 104185952 A | 12/2014 |

OTHER PUBLICATIONS

International Search Report and Written Opinion for PCT/US2012/031031, mailed Nov. 30, 2012, 6 pages.
(Continued)

*Primary Examiner* — Albert Decady
*Assistant Examiner* — Enamul M Kabir
(74) *Attorney, Agent, or Firm* — Schwabe, Williamson & Wyatt, P.C.

(57) ABSTRACT

Embodiments of the present disclosure describe devices, apparatus, methods, computer-readable media and system configurations for processing elementary check nodes associated with an iterative decoder in a manner that conserves computing resources. In various embodiments, first and second sets of m tuples may be received, e.g., as input for the elementary check node. Each tuple may include a symbol and a probability that the symbol is correct, and the first and second sets of m tuples may be sorted by their respective probabilities. In various embodiments, less than all combinations of the first and second sets of m tuples may be computed for consideration as output of the elementary check node, and some computed combinations may be eliminated from consideration as output. In various embodiments, the elementary check node may output a set of m output tuples with the highest probabilities. Other embodiments may be described and/or claimed.

27 Claims, 6 Drawing Sheets

(58) Field of Classification Search
CPC .......... H03M 13/1117; H03M 13/1171; H03M 13/13; H03M 13/15; H03M 13/1515; H03M 13/6577; H03M 13/11; H04L 1/0057; H02M 3/335; G06F 11/00; G11C 29/00
See application file for complete search history.

(56) References Cited

U.S. PATENT DOCUMENTS

| | | | |
|---|---|---|---|
| 2002/0095640 A1* | 7/2002 | Arad | H03M 13/2957 |
| | | | 714/792 |
| 2005/0257116 A1* | 11/2005 | Zarrinkhat | H03M 13/1105 |
| | | | 714/755 |
| 2007/0011564 A1 | 1/2007 | Kons et al. | |
| 2007/0089024 A1* | 4/2007 | Yu | H03M 13/1111 |
| | | | 714/758 |
| 2008/0246639 A1* | 10/2008 | Sakai | H03M 13/1117 |
| | | | 341/107 |
| 2009/0024905 A1 | 1/2009 | Shalvi et al. | |
| 2009/0037795 A1* | 2/2009 | Verdu | H03M 13/1111 |
| | | | 714/780 |
| 2010/0142229 A1 | 6/2010 | Chen et al. | |
| 2011/0066917 A1* | 3/2011 | Heinrich | H03M 13/1117 |
| | | | 714/752 |
| 2011/0119554 A1 | 5/2011 | Savin | |
| 2011/0161785 A1 | 6/2011 | Pyndiah et al. | |

OTHER PUBLICATIONS

International Preliminary Report on Patentability for PCT/US2012/031031, mailed Oct. 9, 2014, 5 pages.
Chinese First Office Action mailed Jul. 27, 2016, issued in corresponding Chinese Patent Application 201280071915.0.

* cited by examiner

PROCESSING ELEMENTARY CHECK NODES OF AN ITERATIVE DECODER

CROSS REFERENCE TO RELATED APPLICATION

The present application is a national phase entry under 35 U.S.C. §371 of International Application No. PCT/US2012/031031, filed Mar. 28, 2012, entitled "PROCESSING ELEMENTARY CHECK NODES OF AN ITERATIVE DECODER," which designates, among the various States, the United States of America, and the entire contents and disclosures of which are hereby incorporated by reference in their entireties.

FIELD

Embodiments of the present invention relate generally to the field of data processing, and more particularly, to processing elementary check nodes of iterative decoders.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

An error correction code ("ECC") decoder may be used to decode encoded data, which may include one or more "codewords," on a channel. For example, a memory controller may use an ECC decoder to handle bit errors and recover data associated with an ECC codeword stored in a die of non-volatile memory ("NVM"). As another example, an ECC decoder may be used to handle bit errors and recover data associated with encoded incoming data on a wired or wireless communication channel.

An iterative decoder such as a non-binary low-density parity-check ("LDPC") decoder may process a codeword multiple times, with each iteration bringing the codeword closer to the original data. In one form of iterative decoding called "extended min-sum," symbols and associated probabilities that the symbols are correct may be passed between variable nodes and check nodes corresponding to relationships between the variable nodes. A forward-backward algorithm may be used to break up the computation involved with a single check node into computation involving multiple elementary check nodes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be implemented. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit ("ASIC"), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smart phone (which may include one or more processors), a tablet, laptop computer, a set-top box, a gaming console, and so forth.

Computation for an elementary check node may include sorting tuples (<symbol, probability>) within the elementary check node. Of all the operations involved in executing a non-binary low-density parity-check ("LDPC") decoder, the operations associated with the computation of elementary check nodes may require the most resources, e.g., silicon area. Accordingly, various techniques are described herein for reducing the number of operations associated with the computation of elementary check node, to conserve computing resources.

Figure 1:
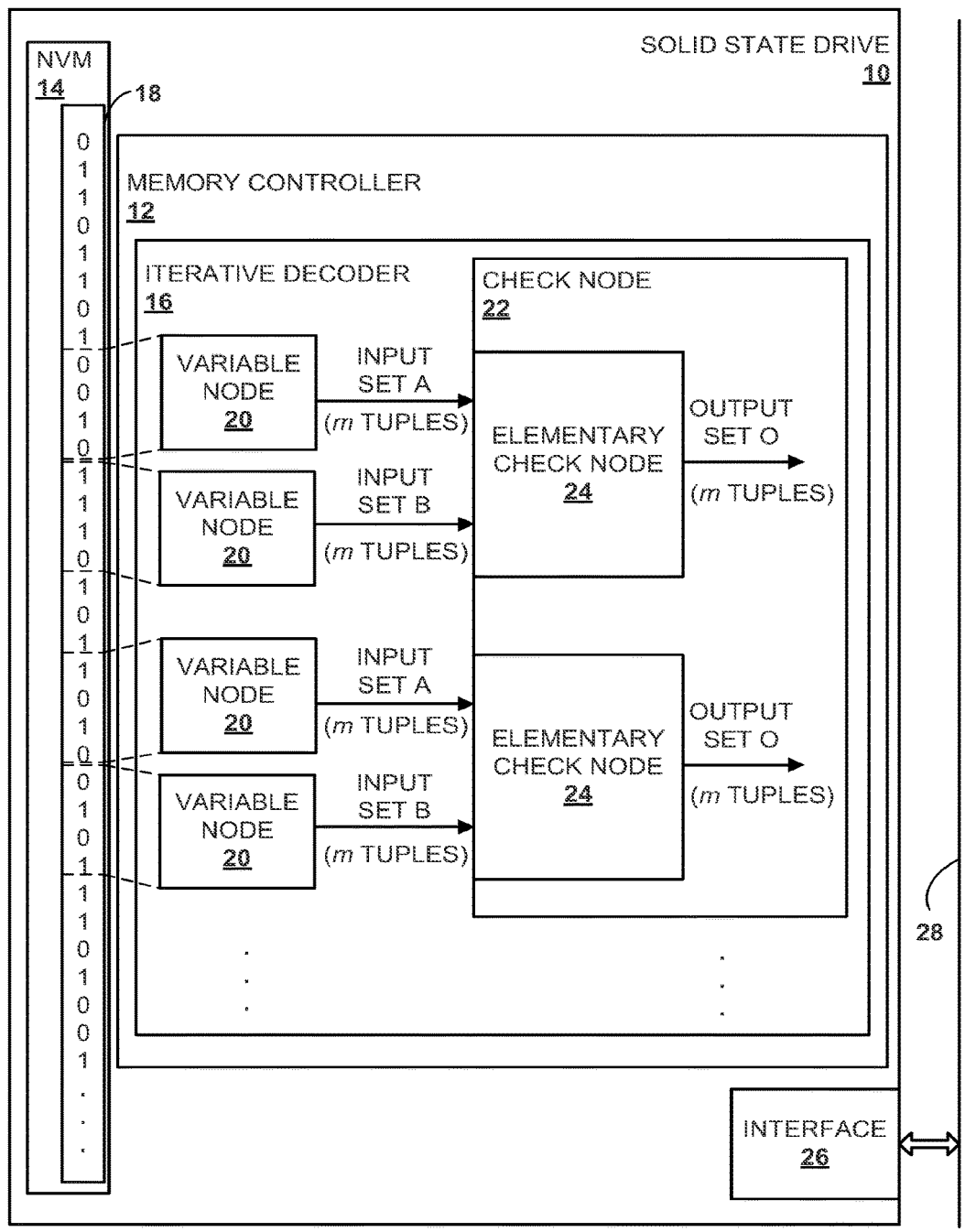
FIG. 1 schematically depicts an example iterative decoder, in accordance with various embodiments.

Referring now to FIG. 1, a storage device 10, shown here in the form of a solid state drive ("SSD"), may include a memory controller 12 and non-volatile memory ("NVM") 14. In some embodiments, NVM 14 may be NAND flash memory. In various embodiments, NVM 14 may be other types of NVM, such as ferroelectric random-access memory ("FeTRAM"), nanowire-based NVM, phase change memory ("PCM"), PCM with switch ("PCMS"), and so forth. In various embodiments, storage device 10 may be other types of storage devices, such as a hard disk drive ("HDD").

Memory controller may further include an iterative decoder 16 that may be configured to decode encoded data, or a "codeword," stored on a channel 18 of NVM 14. In various embodiments, iterative decoder 16 may be a LDPC decoder, and the codewords may have been encoded with an LDPC encoder (not shown). Other iterative encoding/decoding schemes also may be used. In some embodiments, memory controller 12 and iterative decoder 16 may be separate but operatively coupled.

In various embodiments, storage device 10 may be configured to be coupled to a host computing device (not shown), such as various computing and/or consumer electronic devices/appliances, including but not limited to desktop, laptop, or tablet computers. To that end, an interface 26 may comprise any suitable interface for coupling the storage device 10 to the host computing device, such as, for example, but not limited to, a Serial Advanced Technology Attachment ("SATA") interface, a serial attached SCSI ("SAS") interface, a universal serial bus ("USB") interface, a peripheral control interface ("PCI"), or other suitable device interface. In various embodiments, interface 26 may operably couple storage device 10 to a bus 28, which in turn may be operably coupled to other components (not shown) of the host computing device. In various embodiments, bus 28 may be a SATA bus.

In addition to a channel of memory, in various other embodiments, channel 18 may be any medium capable of storing or transmitting data, including but not limited to a wired or wireless communication channel. For example, LDPC decoding may be used in various wireless communication standards, such as Wi-Fi (IEEE 802.11 family), WiMAX (IEEE 802.16 family), 10 Gigabit Ethernet ("10GE" or "10GbE"), and so on. LDPC decoding could also be used with other wireless standards, such as Long Term evolution ("LTE"), 3G, 4G, 5G, and beyond. In such cases, channel 18 may hold LDPC-encoded data received over such a wireless medium.

Regardless of the nature of channel 18, iterative decoder 16 may be configured to divide the codeword among a plurality of variable nodes 20. In binary LDPC decoders, each variable node may be a single bit to store a logical one or a logical zero. In non-binary LDPC decoders, such as iterative decoder 16 in FIG. 1, each variable node 20 may represent a group of bits, and each group may form a q-ary symbol. In either case, the variable nodes may be related or relatable to each other by a plurality of check nodes 22 (of which only one is depicted in FIG. 1).

Processing a check node 22 may include processing multiple elementary check nodes 24. An elementary check node 24 may receive inputs from two or more variable nodes 20 or check nodes 22. In FIG. 1, the top elementary check node 24 receives input from the top two variable nodes 20. Iterative decoder 16 may provide, as output of elementary check node 24, a set O of output tuples.

A tuple may include a symbol and a probability that the symbol is correct (<symbol, probability>). In various embodiments, the probability may be represented in logarithmic form, e.g., as a log density ratio ("LDR").

In various embodiments, a result tuple may be computed by performing an operation using the symbol and/or probability of one tuple and the symbol and/or probability of another tuple as inputs. For example, an iterative decoder may compute a result tuple based on two input tuples by performing an XOR operation with the tuples' symbols, by multiplying probabilities of the tuples, and/or by adding logs of the tuples' LDRs.

In various embodiments, m may be a number of tuples having the highest probabilities that are ultimately output by an elementary check node. In various embodiments, in may be an integer greater than zero ($m \in Z^>$). In various embodiments, each input of elementary check node 24 may include a set of m tuples. Two sets of m tuples may be may be used in various combinations to compute m×m possible result tuples. However, some of these result tuples may have probabilities that are low (e.g., they are unlikely to be correct), and so computing them may not be worthy of computing resources. Accordingly, in various embodiments, iterative decoder 16 may selectively compute a subset of the m×m possible combinations, and consider only tuples within the subset when sorting elementary check node 24.

Figure 2:
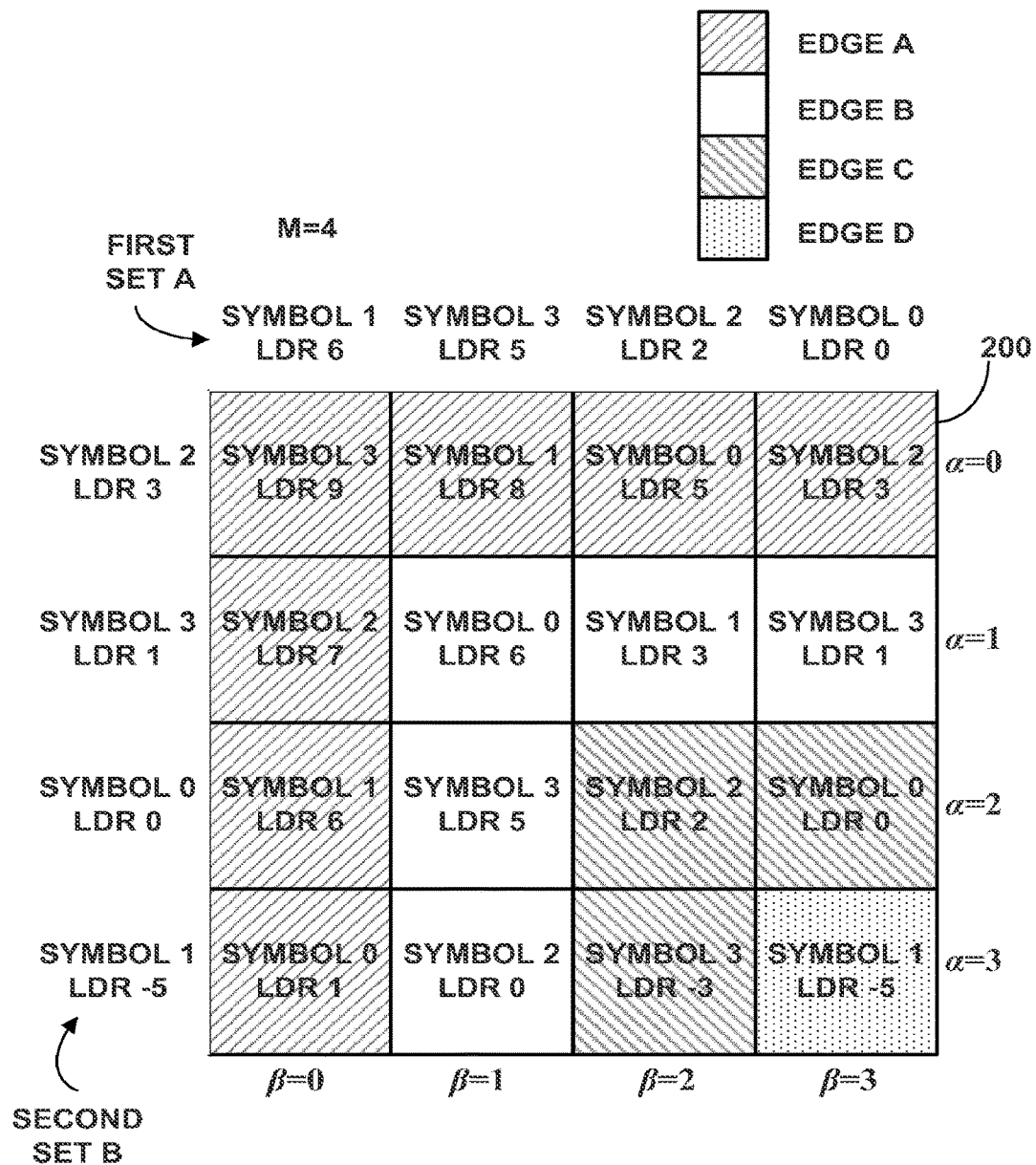
FIG. 2 schematically depicts an example conceptual matrix associated with an example elementary check node, in accordance with various embodiments.

FIG. 2 schematically depicts a conceptual matrix 200 of m×m elements corresponding to m×m tuple combinations of two sets of m tuples used as input at an elementary node (e.g., 16 in FIG. 1). Conceptual matrix 200 demonstrates how disclosed techniques may be used to process an elementary node. However, disclosed techniques may not require construction of an actual two-dimensional matrix, as a data structure or otherwise.

In FIG. 2, m is set to 4, but in other embodiments, m may be set to other positive integers. Two input sets of m tuples are shown: a first set A and a second set B. In various embodiments, each element of conceptual matrix 200 may represent a tuple that would result from a computation using, as input, a tuple from the first set A that corresponds to a column containing the element and a tuple from the second set B that corresponds to a row containing the element.

Upon receiving the sets A and B as inputs for elementary check node 24, iterative decoder 16 may sort the input sets by their respective probabilities. This can be seen in FIG. 2, where m columns of conceptual matrix 200 correspond to m tuples of the sorted first set A: {<1,6>, <3,5>, <2,2>, <0,0>}. Similarly, m rows of conceptual matrix 200 correspond to m tuples of the sorted second set of tuples B: {<2,3>, <3,1>, <0,0>, <1,−5>}.

While all the m×m elements of conceptual matrix 200 are shown in FIG. 2 populated with results of computing all possible combinations of tuples from sets A and B, this is for illustrative purposes only. Using techniques described herein, computation of all tuples of conceptual matrix 200 may be avoided. Instead, a subset of the m×m tuples may be computed and sorted to select m output tuples of the elementary check node.

In various embodiments, at least m result tuples from a combination of an outermost row (top row in FIG. 2) and outermost column (leftmost column in FIG. 2) may be selected for consideration as output. An iterative decoder such as iterative decoder 16 in FIG. 1 may compute an intermediate set C of 2m−1 tuples that correspond to elements of the outermost row and the outermost column of conceptual matrix 200. Together, the outermost row and column may form an "edge" of conceptual matrix 200, indicated in FIG. 2 as "Edge A." Other edges are also shown in FIG. 2. Edge B includes five elements in the row and column that are immediately adjacent to and inside of Edge A. Edge C includes three elements in the row and column that are immediately adjacent to and inside of Edge B. Edge D includes the single innermost element.

In various embodiments, the intermediate set C of 2m−1 tuples in Edge A may be computed by performing at least the following operations:

$\forall$ tuple $A_x \in$ first set A, wherein $x \in Z$ and $0 \leq x \leq m-1$, computing a result tuple $C_{x,\alpha}$ using $A_x$ and a tuple $B_\alpha$ of the second set B having a highest probability as input. In FIG. 2, for example, $B_\alpha$ is <2,3> and $\alpha$=0.

$\forall$ tuple $B_y \in$ second set B, wherein $y \in Z$ and $1 \leq y \leq m-1$, computing a result tuple $C_{\beta,y}$ using $B_y$ and a tuple $A_\beta$ of the first set A having the highest probability as input. In FIG. 2, for example, $A_\beta$ is <1,6> and $\beta$=0.

In various embodiments, at least m−1 tuples of the 2m−1 computed tuples in set C having the lowest probabilities may then be eliminated, e.g., by iterative decoder 16, from consideration as output. In various embodiments, at least m−1 tuples of the intermediate set C may be eliminated from consideration as output using an odd-even merge sort algorithm (e.g., Batch er merge sort).

Figure 3:
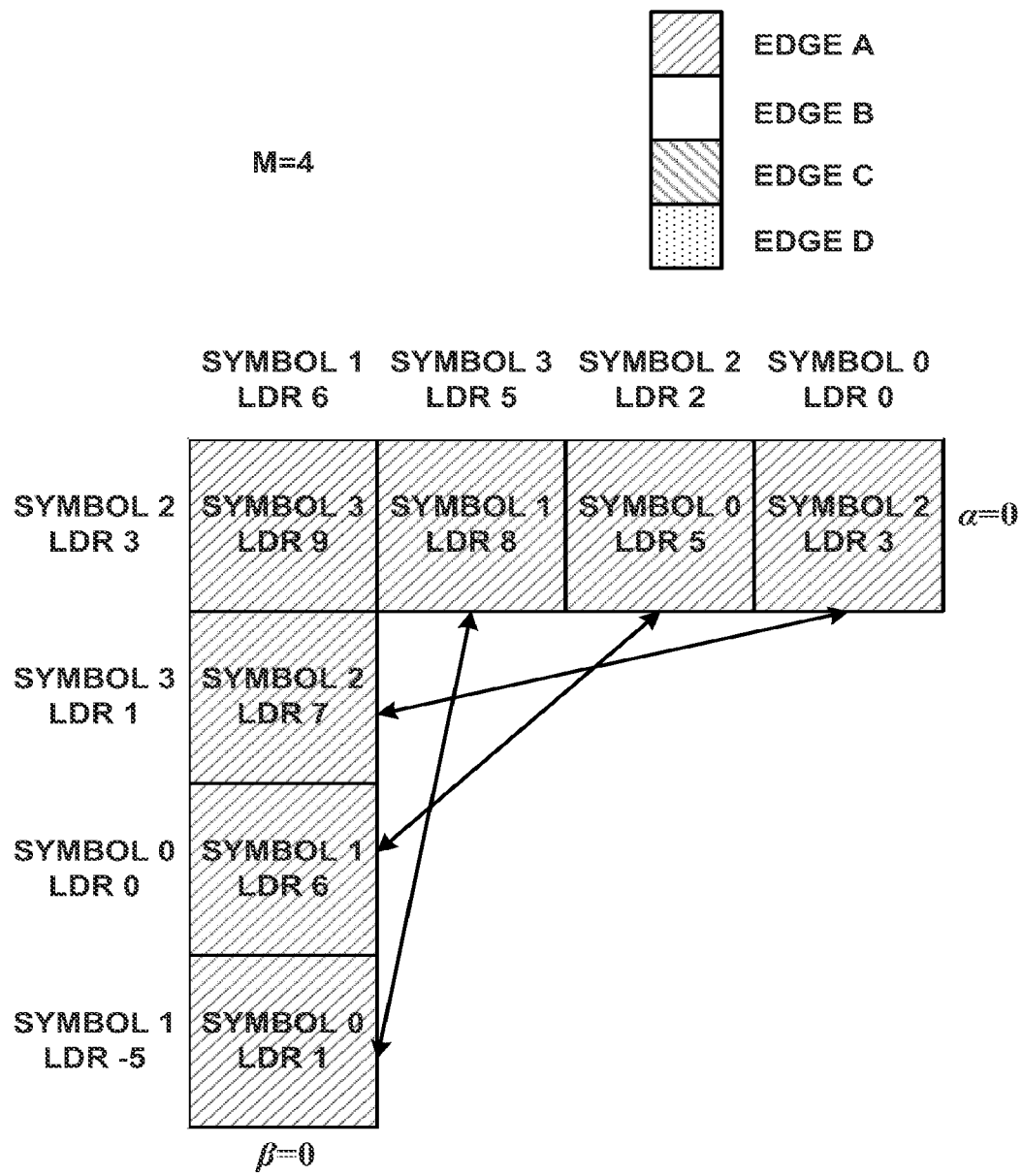
FIG. 3 schematically depicts how an edge of the conceptual matrix of FIG. 1 may be sorted, in accordance with various embodiments.

An example of this is shown in FIG. 3, which shows only those elements of conceptual matrix 200 of FIG. 2 corresponding to intermediate set C/Edge A. A first input to the odd-even merge sort algorithm may be a first subset $C_t$ of intermediate set C, where $C_t = C_{1,\alpha}, C_{2,\alpha}, \ldots C_{m-1,\alpha}$. In FIG. 2, the first input may include the second, third and fourth elements/tuples from the left in the topmost row of conceptual matrix 200. A second input to the odd-even merge sort algorithm may be a second subset $C_v$ of intermediate set C, where $C_v = C_{\beta,1}, C_{\beta,2}, \ldots C_{\beta,m-1}$. In FIG. 2, the second input may include the second, third and fourth elements/tuples from the top in the leftmost column of conceptual matrix 200.

To perform the odd-even merge, the first element from $C_t$ may be compared to the third element of $C_v$, the second element of $C_t$ may be compared to the second element of $C_v$, the third element of $C_t$ may be compared to the first element of $C_v$, and so on. In various embodiments, the tuple of each comparison having the lower probability may be eliminated from consideration as output. In various embodiments, an iterative decoder such as iterative decoder 16 in FIG. 1 may provide, as output of an elementary check node, a set O of m output tuples that includes at least some of the m tuples that remain from the 2m−1 tuples of intermediate set C, after the odd-even sorting.

As for the remaining elements of conceptual matrix 200 (Edges B-D), an iterative decoder such as iterative decoder 16 in FIG. 1 may select those elements/tuples that should be considered for output in addition to the elements/tuples from Edge A that remain after the odd-even sorting. In FIG. 2, all elements above and to the left of a given element may be guaranteed to have higher probabilities. Thus, a given element may not need be considered for output if there are nz or more elements above and to its left. Accordingly, in various embodiments, an iterative decoder such as iterative decoder 16 in FIG. 1 may compute another intermediate set of tuples D corresponding to elements of conceptual matrix 200 other than the 2m−1 tuples of set C, such as Edges B-D in FIG. 1, that have less than m elements above and to the left in the conceptual matrix.

The intermediate set D may be computed in various ways. For example, assume that for a given element in conceptual matrix 200, i denotes the element's column. Assume also that the columns are numbered, beginning at the outermost column $\beta$, which corresponds to an input tuple $A_\beta$ of the set A having the highest probability (<1,6> in FIG. 2), to m−1−$\beta$. This is depicted in FIG. 2, where the outermost column is the leftmost column and the columns are numbered 0-3 from left to right. Likewise, assume that j denotes the element's row, and the rows are numbered, beginning at the outermost row $\alpha$, which corresponds to an input tuple having the highest probability, from j=$\alpha$ to m−1−$\alpha$. In the example of FIG. 2, $\alpha$=0 and the rows are numbered 0-3 from top to bottom. Under these assumptions, there may be (i+1)×(j+1)−1 elements that may be guaranteed to have higher probabilities than a given element $E_{i,j}$.

In FIG. 2, these elements may be above and to the left of a given element. However, the input sets may be ordered differently. For example, the column corresponding to the input tuple having the highest probability may instead be the rightmost column (e.g., $\beta$=m), and the row corresponding to the input tuple having the highest probability may be the bottommost row (e.g., $\alpha$=m). In such case, a given element, elements below and to the right may be guaranteed to have higher probabilities.

Accordingly, in various embodiments, $\forall$(i,j) where i$\in$Z, j$\in$Z, $\alpha$=0, $\beta$=0, 1$\leq$i$\leq$m−1, 1$\leq$j$\leq$m−1, and (i+1)×(j+1)−1<m, an iterative decoder such as iterative decoder 16 in FIG. 1 may compute a result tuple $D_{i,j}$ using $A_i$ and $B_j$ as input. In various embodiments, the iterative decoder may include these result tuples $D_{i,j}$ in the intermediate set D.

Setting $\alpha$ and $\beta$ to zero does not necessarily mean that the leftmost column and topmost row correspond to input tuples of sets A and B, respectively, having the highest probabilities. Rather, it may indicate that whatever column/row corresponds to the input tuple having the highest probability is indexed to 0, and the remaining columns/rows may be indexed (left to right, right to left, top to bottom or bottom to top) starting at 0. For example, if a rightmost column of a conceptual matrix corresponds to an input tuple having the highest probability of a set of input tuples, then the columns may be indexed, from right to left, 0, 1, 2, . . . m−1. Thus, regardless of how the input sets A and B are ordered, the above-described techniques may be used to compute the intermediate set D.

After the intermediate set D of tuples is computed, in various embodiments, the iterative decoder may then merge tuples from the intermediate sets C and D into the set O that is to be output. In various embodiments, this may include selecting m tuples from the intermediate sets C and D having the highest probabilities for inclusion in the set O. For example, tuples in the intermediate set D may be organized, e.g., by iterative decoder 16, into subsets corresponding to edges (e.g., B-D) within conceptual matrix 200. The subsets may then be merged with each other and the at least some of the remaining 711 tuples of the 2m−1 tuples of the intermediate set C (Edge A) to obtain the set of m tuples for the output set O. In various embodiments, subsets representing combined edges (e.g., Edges B and C) may be merged with other subsets (e.g., Edge A).

In various embodiments, the merging of intermediate sets C and D may include constructing a tree data structure having, as nodes, a plurality of subsets of the intermediate set D, and the intermediate set C. For example, and referring back to FIG. 2, inner edges such as Edge B and Edge C may be selected as nodes and merged with other inner edges, as well as with Edge A.

In various embodiments, s may be a number of edges between two edges containing two tuples. For instance, when comparing a tuple in Edge A and Edge B, s=0. Put another way, for two given elements $E_{i,j}$ and $E_{x,y}$ of conceptual matrix 200, s∈$Z^≥$ and s=|min(i,j)−min(x,y)|−1 (where "min(x,y)" means the minimum of x and y). In various embodiments, $(s+2)^2-1$ tuples of one edge, e.g., Edge A in FIG. 2, may have higher probabilities than any tuple of an inner edge. Accordingly, one or more tuples $D_{i,j}$ of the set D may be selectively sorted against the m−$(s+2)^2$+1 tuples of the set C having the lowest probabilities. In various embodiments, the one or more tuples $D_{i,j}$ of the set D may be sorted internally before being selectively sorted against the tuples of the set C. In various embodiments, $(s+2)^2-1$ tuples of the set C having the highest probabilities may be considered for output without comparison to tuples of the set D.

Figure 4:
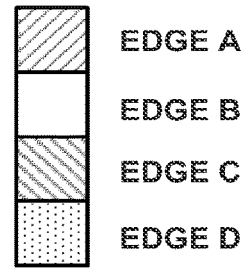
FIG. 4 schematically depicts elements of the conceptual matrix of FIGS. 1 and 2 that may be considered for output, in accordance with various embodiments.
Figure 4:
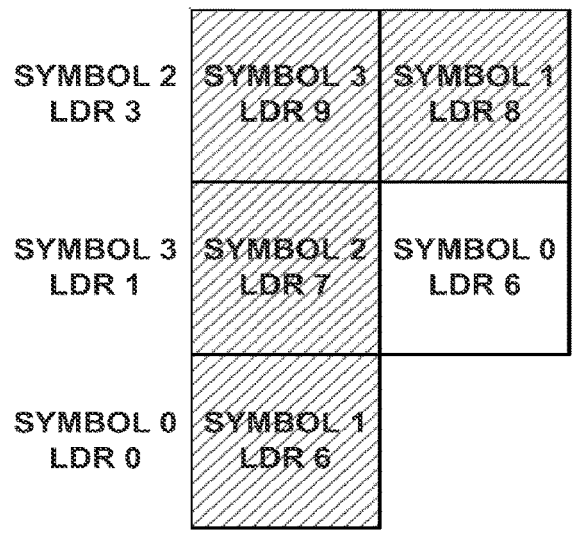
Figure 4:
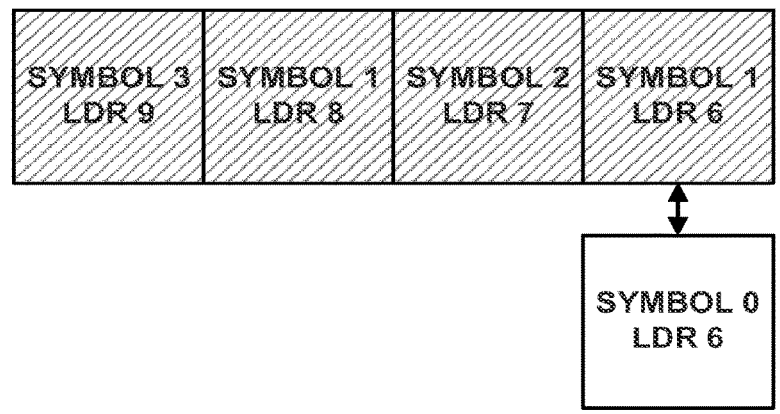

An example of this is seen in FIG. 4. The computed tuples are those left in Edge A after the odd-even sorting, and one tuple from Edge B that had less than m tuples above and to the left. Thus, $(s+2)^2-1$ tuples of Edge A may be selected for inclusion in output set O without any comparison to tuples in Edge B. The one tuple from Edge B may be selectively sorted against the m−$(s+2)^2$+1 remaining tuples of Edge A having the lowest probabilities. In this example, m=4 and s=0, and so the top three tuples of Edge A have higher probabilities than the one tuple from Edge B. Thus, as shown at the bottom of FIG. 4, the one tuple from Edge B is selectively sorted against one tuple of Edge A having the lowest probability. Here, the probabilities (6) are equal, and so either tuple may be selected. Otherwise, the tuple with the higher probability would be selected for inclusion in the m tuples of set O for outputting.

Figure 5:
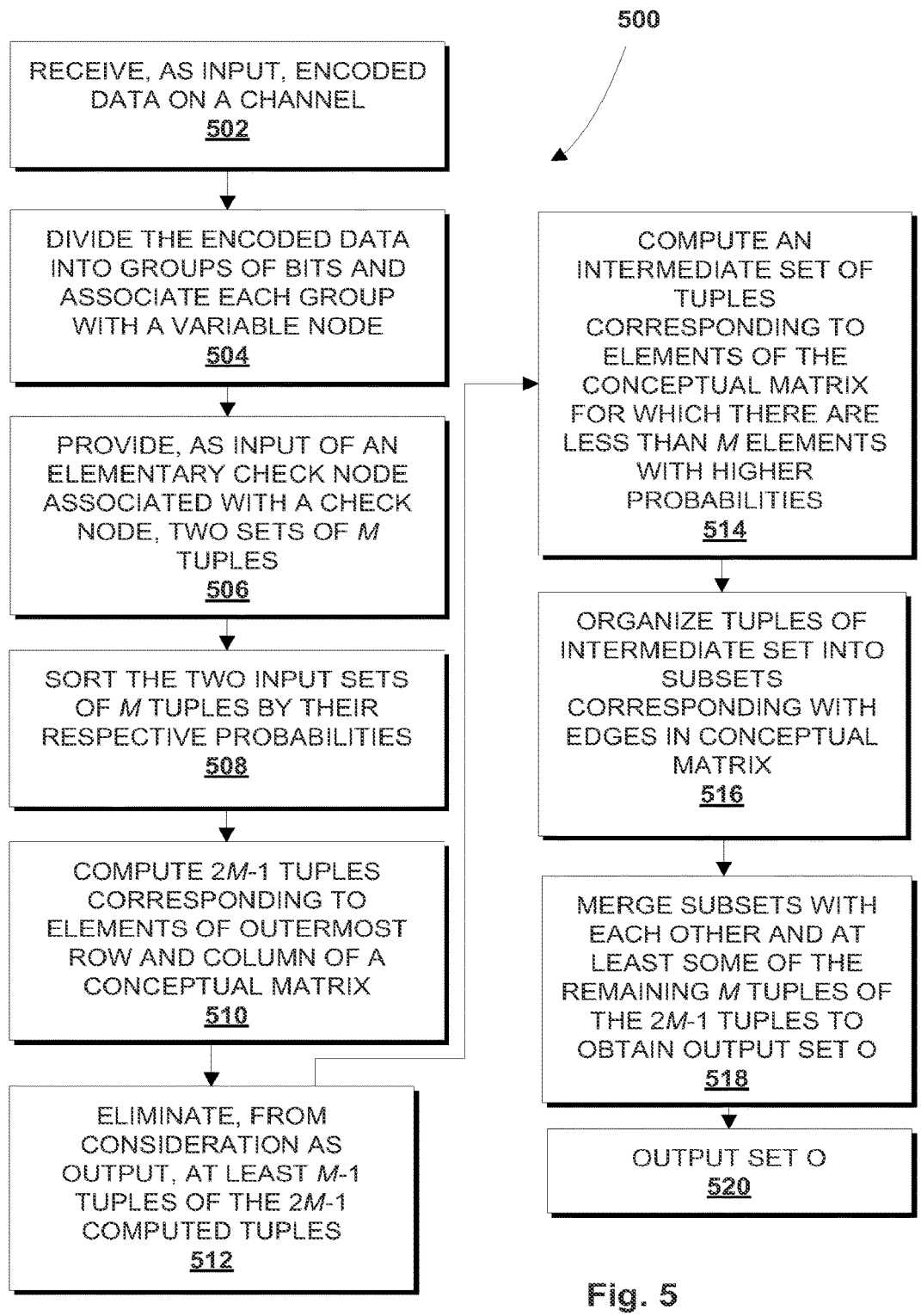
FIG. 5 schematically depicts an example method, in accordance with various embodiments.

FIG. 5 depicts an example method 500 that may be implemented, e.g., by an iterative decoder such as iterative decoder 16 of FIG. 1, to decode ECC codewords on a channel, in accordance with various embodiments. At block 502, the iterative decoder may receive, as input, encoded data on a channel. For example, and as discussed above, the iterative decoder may receive encoded data from a die of non-volatile memory, or from a wired or wireless communications channel. At block 504, the encoded data may be divided, e.g., by the iterative decoder, into groups of bits, and each group may be associated with a variable node.

At block 506, the iterative decoder may provide, as input of an elementary check node associated with a check node, two sets of m tuples. Each tuple may include m possible symbols from two variable nodes and associated probabilities that each possible symbol is correct. At block 508, the iterative decoder may sort the two input sets of in tuples by their respective probabilities (e.g., yielding input sets like first set A and second set B in FIG. 2).

At block 510, the iterative decoder may compute 2m−1 tuples corresponding to elements of an outermost row and an outermost column of a conceptual matrix (e.g., intermediate set C/Edge A described above). At block 512, the iterative decoder may eliminate, from consideration as output, at least m−1 tuples of the 2m−1 computed tuples (e.g., of set C) having the lowest probabilities. As described above, in various embodiments, the m−1 tuples may be eliminated using an odd-even sorting algorithm (e.g., Batcher merge sort).

At block 514, the iterative decoder may compute an intermediate set of tuples (e.g., set D described above) corresponding to elements of the conceptual matrix, other than the 2m−1 tuples, for which there are less than m elements in the conceptual matrix with higher probabilities. As described above, depending on how the input sets are incorporated/sorted into the conceptual matrix, for a given element, this may include elements above and to the left, below and to the right, above and to the right, or below and to the left.

At block 516, the iterative decoder may organize tuples in the intermediate set D computed at block 514 into subsets corresponding to edges within the conceptual matrix. At 518, the iterative decoder may merge the subsets with each other and at least some of the remaining m tuples of the 2m−1 tuples (e.g., intermediate set C) to obtain the set O of m tuples for output. In various embodiments, the iterative decoder may accomplish this merging by constructing a tree data structure having, as nodes, a plurality of subsets of the set D, and the set C, and sorting the tree. At block 520, the iterative decoder may output the set of in output tuples resulting from the operations of block 518 (e.g., the set O described above).

Figure 6:
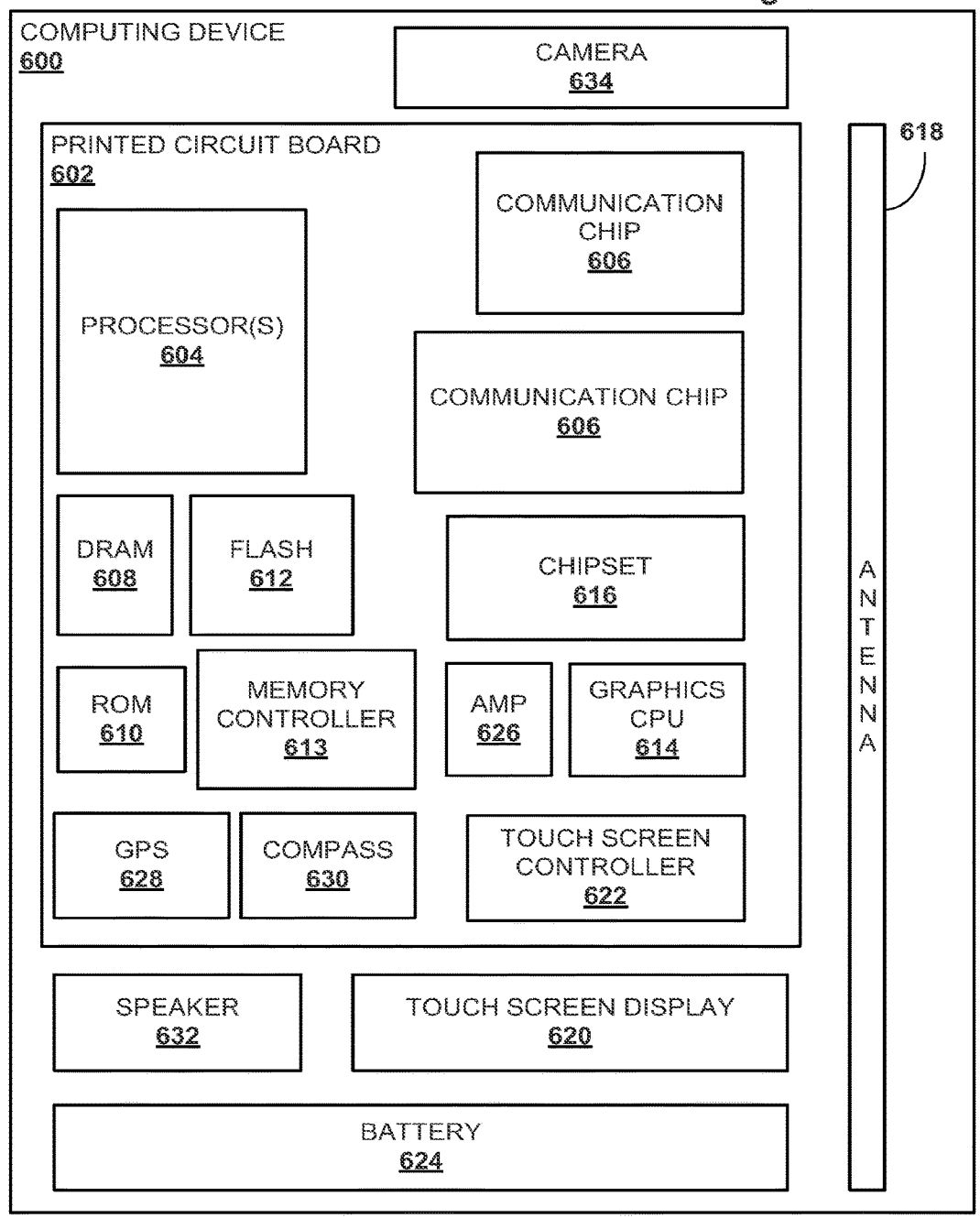
FIG. 6 schematically depicts an example system, in accordance with various embodiments.

FIG. 6 illustrates a computing device 600 in accordance with various embodiments. The computing device 600 houses a printed circuit board ("PCB") 602. The PCB 602 may include a number of components, including but not limited to a processor 604 and at least one communication chip 606. The processor 604 may be physically and electrically coupled to the PCB 602. In various embodiments, the at least one communication chip 606 may also be physically and electrically coupled to the PCB 602. In further implementations, the communication chip 606 may be part of the processor 604. In various embodiments, the processor 604 may be integrated on the same die with other components to form a System on Chip ("SoC").

Depending on its applications, computing device 600 may include other components that may or may not be physically and electrically coupled to the PCB 602. These other components include, but are not limited to, volatile memory (e.g., DRAM 608), non-volatile memory (e.g., ROM 610), flash memory 612, a memory controller 613, a graphics processor 614, a digital signal processor (not shown), a crypto processor (not shown), a chipset 616, an antenna 618, a display (not shown), a touch screen display 620, a touch screen controller 622, a battery 624, an audio codec (not shown), a video codec (not shown), a power amplifier 626, a global positioning system ("GPS") device 628, a compass 630, an accelerometer (not shown), a gyroscope (not shown), a speaker 632, a camera 634, and a mass storage device (such as hard disk drive, compact disk ("CD"), digital versatile disk ("DVD"))(not shown), and so forth.

The communication chip 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, Long Term evolution ("LTE"), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 may include an integrated circuit die packaged within the processor 604. In various embodiments, the integrated circuit die of the processor 604 may include one or more devices, such as transistors or metal interconnects, that are formed to facilitate iterative decoding of ECC codewords using one or more techniques described herein. The term "processor" may refer to any device or portion of a device that processes electronic data from registers and/or memory to transform that electronic data into other electronic data that may be stored in registers and/or memory.

The communication chip 606 may also include an integrated circuit die packaged within the communication chip 606. In various embodiments, the integrated circuit die of the communication chip 606 may include one or more devices, such as transistors or metal interconnects, that are formed to facilitate iterative decoding of ECC codewords.

In various implementations, the computing device 600 may be a laptop, a netbook, a notebook, an ultrabook, a smart phone, a tablet, a personal digital assistant ("PDA"), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

The following paragraphs describe various embodiments, which may be implemented in devices, apparatus, methods, computer-readable media (transitory and non-transitory), systems, and so forth.

In various embodiments, a first set of m tuples A and a second set of m tuples B may be received, each tuple including a symbol and a probability that the symbol is correct, wherein $m \in Z^>$. In various embodiments, the first set A may be sorted by the probabilities of its tuples, and the second set B may be sorted by the probabilities of its tuples. In various embodiments, a set C of 2m−1 tuples may be computed by performing at least the following operations:

$\forall$ tuple $A_x \in$ the first set A, wherein $x \in Z$ and $0 \le x \le m-1$, computing a result tuple $C_{x,\alpha}$ using $A_x$ and a tuple $B_\alpha$ of the second set B having a highest probability as input; and $\forall$ tuple $B_y \in$ the second set B, wherein $y \in Z$ and $1 \le y \le m-1$, computing a result tuple $C_{\beta,y}$ using $B_y$ and a tuple $A_\beta$ of the first set A having the highest probability as input.

In various embodiments, at least m−1 tuples of the set C having the lowest probabilities may be eliminated from consideration as output. In various embodiments, a set O of m output tuples that includes at least some remaining tuples of the set C may be output. In various embodiments, the computing may include performing an XOR operation using a symbol of the tuple from the set A with a symbol of the tuple from the set B. In various embodiments, the computing may include adding a log of the probability of the tuple from the set A with a log of the probability of the tuple from the set B.

In various embodiments, the eliminating may include sorting tuples of the set C using an odd-even merge sort algorithm. In various embodiments, a first input to the odd-even merge sort algorithm may be a first subset $C_t$ of C, where $C_t = C_{1,\alpha}, C_{2,\alpha}, \ldots C_{m-1,\alpha}$, and a second input to the odd-even merge sort algorithm may be a second subset $C_v$ of C, where $C_v = C_{\beta,1}, C_{\beta,2}, \ldots C_{\beta,m-1}$.

In various embodiments, a set D may be computed by, $\forall(i,j)$ where $i \in Z$, $j \in Z$, $\alpha=0$, $\beta=0$, $1 \le i \le m-1$, $1 \le j \le m-1$, and $(i+1) \times (j+1) - 1 < m$, computing a result tuple $D_{i,j}$ using $A_i$ and $B_j$ as input, and including $D_{i,j}$ in the set D. In various embodiments, tuples from the sets C and D may be merged into the set O. In various embodiments, the merging may be further implemented by including, to the set O, m tuples from the sets C and D having the highest probabilities. In various embodiments, the merging may include selectively sorting a tuple $D_{i,j}$ of the set D against $m-(s+2)^2+1$ tuples $C_{x,y}$ of the set C having the lowest probabilities, wherein $s \in Z^\ge$ and $s = |\min(i,j) - \min(x,y)| - 1$. In various embodiments, the merging may include constructing a tree data structure having, as nodes, a plurality of subsets of the set D, and the set C.

Although certain embodiments have been illustrated and described herein for purposes of description, a wide variety of alternate and/or equivalent embodiments or implementations calculated to achieve the same purposes may be substituted for the embodiments shown and described. This application is intended to cover any adaptations or variations of the embodiments discussed herein. Therefore, it is manifestly intended that embodiments described herein be limited only by the claims and the equivalents thereof.

What is claimed is:

1. A computer-implemented method of recovering data associated with an error correction code (ECC) codeword received on a channel using an iterative decoder, comprising:

receiving, by an elementary check node of the iterative decoder, a first set of m tuples A and a second set of m tuples B, each tuple including a symbol and a probability that the symbol is correct, wherein $m \in Z^>$;

sorting the first set A by the probabilities of its tuples and the second set B by the probabilities of its tuples;

computing a set C of 2m−1 tuples by performing at least the following operations:

$\forall$ tuple $A_x \in$ the first set A, wherein $x \in Z$ and $0 \le x \le m-1$, computing a result tuple $C_{x,\alpha}$ using $A_x$ and a tuple $B_\alpha$ of the second set B having a highest probability as input; and $\forall$ tuple $B_y \in$ the second set B, wherein $y \in Z$ and $1 \le y \le m-1$, computing a result tuple $C_{\beta,y}$ using $B_y$ and a tuple $A_\beta$ of the first set A having the highest probability as input;

eliminating, from consideration as output, at least m−1 tuples of the set C having the lowest probabilities;

outputting, by the elementary check node, a set O of m output tuples that includes at least some remaining tuples of the set C; and recovering data based at least in part on the set O of m output tuples.

2. The computer-implemented method of claim 1, wherein the computing comprises performing an XOR operation using a symbol of the tuple from the set A with a symbol of the tuple from the set B.

3. The computer-implemented method of claim 1, wherein the computing comprises adding a log of the probability of the tuple from the set A with a log of the probability of the tuple from the set B.

4. The computer-implemented method of claim 1, wherein the eliminating comprises sorting tuples of the set C using an odd-even merge sort algorithm, wherein a first input to the odd-even merge sort algorithm is a first subset $C_t$ of C, where $C_t = C_{1,\alpha}, C_{2,\alpha}, \ldots C_{m-1,\alpha}$, and a second input to the odd-even merge sort algorithm is a second subset $C_v$ of C, where $C_v = C_{\beta,1}, C_{\beta,2}, \ldots C_{\beta,m-1}$.

5. The computer-implemented method of claim 1, further comprising computing a set D by, $\forall(i,j)$ where $i \in Z$, $j \in Z$, $\alpha=0$, $\beta=0$, $1 \le i \le m-1$, $1 \le j \le m-1$, and $(i+1) \times (j+1)-1 < m$, computing a result tuple $D_{i,j}$ using $A_i$ and $B_j$ as input, and including $D_{i,j}$ in the set D.

6. The computer-implemented method of claim 5, further comprising merging tuples from the sets C and D into the set O.

7. The computer-implemented method of claim 6, wherein the merging comprises including, to the set O, m tuples from the sets C and D having the highest probabilities.

8. The computer-implemented method of claim 6, wherein the merging includes selectively sorting a tuple $D_{i,j}$ of the set D against $m-(s+2)^2+1$ tuples $C_{x,y}$ of the set C having the lowest probabilities, wherein $s \in Z^{\ge}$ and $s=|\min(i,j)-\min(x,y)|-1$.

9. The computer-implemented method of claim 6, wherein the merging includes constructing a tree data structure having, as nodes, a plurality of subsets of the set D, and the set C.

10. At least one non-transitory machine-readable medium comprising a plurality of instructions that, in response to being executed on a computing device, cause the computing device to carry out a method according to claim 1.

11. A computer-implemented method of recovering data associated with an error correction code (ECC) codeword received on a channel using an iterative decoder, comprising:
receiving, by an elementary check node of the iterative decoder, a first set of m tuples and a second set of m tuples, each tuple including a symbol and a probability that the symbol is correct;
sorting the first and second sets of m tuples by the respective probabilities of the first and second sets;
computing 2m−1 tuples corresponding to elements of an outermost row and an outermost column of a conceptual matrix having m rows corresponding to the m tuples of the sorted first set and m columns corresponding the m tuples of the sorted second set, wherein each element of the conceptual matrix represents a tuple that results from the computing using, as input, a tuple from the first set corresponding to a row containing the element and a tuple from the second set corresponding to a column containing the element;
eliminating, from consideration as output, at least m−1 tuples of the 2m−1 computed tuples having the lowest probabilities;
outputting, by the elementary check node, a set of m output tuples that includes at least some of a remaining m tuples of the 2m−1 tuples; and
recovering data based at least in part on the set of m output tuples.

12. The computer-implemented method of claim 11, wherein the outermost row is a top row of the conceptual matrix and the outermost column is a far-left column of the conceptual matrix, the method further comprising:
computing an intermediate set of tuples corresponding to elements of the conceptual matrix other than the 2m−1 tuples that have less than m elements above and to the left in the conceptual matrix.

13. The computer-implemented method of claim 12, further comprising organizing tuples in the intermediate set into subsets corresponding to edges within the conceptual matrix, and merging the subsets with each other and the at least some of the remaining m tuples of the 2m−1 tuples to obtain the set of m tuples for the outputting.

14. The computer-implemented method of claim 11, wherein the computing comprises performing an XOR operation using a symbol of the tuple from the first set with a symbol of the tuple from the second set.

15. The computer-implemented method of claim 11, wherein the computing comprises adding a log of a probability of the tuple from the first set with a log of a probability of the tuple from the second set.

16. A system comprising:
a processor;
a channel; and
an iterative decoder to be operated by the processor to decode an error correction code (ECC) codeword on the channel, wherein the iterative decoder is to organize the ECC codeword into a plurality of variable nodes related to each other by a plurality of check nodes, the iterative decoder to:
provide, as input to an elementary check node associated with a check node of the plurality of check nodes, a first set of m tuples A and a second set of m tuples B, each tuple including a symbol that represents a possible value of a group of bits in the ECC codeword and a probability that the symbol is correct, wherein $m \in Z^{>}$;
sort the first set A by the probabilities of its tuples and the second set B by the probabilities of its tuples;
compute a set C of 2m−1 tuples by performance at least the following operations:
$\forall$ tuple $A_x \in$ the first set A, wherein $x \in Z$ and $0 \le x \le m-1$, compute a result tuple $C_{x,\alpha}$ with $A_x$ and a tuple $B_\alpha$ of the second set B with a highest probability as input; and
$\forall$ tuple $B_y \in$ the second set B, wherein $y \in Z$ and $1 \le y \le m-1$, compute a result tuple $C_{\beta,y}$ with $B_y$ and a tuple $A_\beta$ of the first set A with the highest probability as input;
eliminate, from consideration as output of the elementary check node, at least m−1 tuples of the set C with the lowest probabilities;
provide, as output of the elementary check node, a set O of m output tuples that includes at least some tuples of the set C that remain after the elimination; and
decode the ECC codeword based at least in part on the set O of m output tuples.

17. The system of claim 16, wherein the iterative decoder is to compute at least one tuple of the set C of 2m−1 tuples by performing an XOR operation using a symbol of the tuple from the set A with a symbol of the tuple from the set B.

18. The system of claim 16, wherein the iterative decoder is to compute at least one tuple of the set C of 2m−1 tuples by adding a log of a probability of the tuple from the set A with a log of a probability of the tuple from the set B.

19. The system of claim 16, wherein the iterative decoder is further to sort tuples of the set C using an odd-even merge sort algorithm, wherein a first input to the odd-even merge sort algorithm is a first subset $C_t$ of C, where $C_t = C_{1,\alpha}, C_{2,\alpha}, \ldots C_{m-1,\alpha}$, and a second input to the odd-even merge sort algorithm is a second subset $C_v$ of C, where $C_v = C_{\beta,1}, C_{\beta,2}, \ldots C_{\beta,m-1}$.

20. The system of claim 16, wherein the iterative decoder is further to, $\forall(i,j)$ where $i \in Z$, $j \in Z$, $\alpha=0$, $\beta=0$, $1 \le i \le m-1$, $1 \le j \le m-1$, and $(i+1) \times (j+1)-1 < m$, compute a result tuple $D_{i,j}$ using $A_i$ and $B_j$ as input, and including $D_{i,j}$ in a set D.

21. The system of claim 20, wherein the iterative decoder is further to merge tuples from the sets C and D into the set O.

22. The system of claim 21, wherein the iterative decoder is further to include, in the set O, m tuples from the sets C and D with the highest probabilities.

23. The system of claim 21, wherein the iterative decoder is further to selectively sort a tuple $D_{i,j}$ of the set D against $m-(s+2)^2+1$ tuples $C_{x,y}$ of the set C with the lowest probabilities, wherein $s \in Z^{\geq}$ and $s=|\min(i,j)-\min(x,y)|-1$.

24. The system of claim 21, wherein the iterative decoder is further to construct a tree data structure that includes, as nodes, a plurality of subsets of the set D, and the set C.

25. A system comprising:
a processor;
a channel; and
an iterative decoder to be operated by the processor to decode an error correction code (ECC) codeword on the channel, wherein the iterative decoder is to organize the ECC codeword into a plurality of variable nodes related to each other by a plurality of check nodes, the iterative decoder to:
provide, as input for an elementary check node associated with a check node of the plurality of check nodes, a first set of m tuples and a second set of m tuples, each tuple including a symbol and a probability that the symbol is correct;
sort the first and second sets of m tuples by the respective probabilities of the first and second sets;
compute 2m−1 tuples that correspond to elements of an outermost row and an outermost column of a conceptual matrix with m rows corresponding to the m tuples of the sorted first set and m columns corresponding the m tuples of the sorted second set, wherein each element of the conceptual matrix represents a tuple that results from the computation using, as input, a tuple from the first set that corresponds to a row that contains the element and a tuple from the second set that corresponds to a column that contains the element;
eliminate, from consideration as output, at least m−1 tuples of the 2m−1 computed tuples with the lowest probabilities;
provide, as output of the elementary check node, a set of m output tuples that includes at least some of a remaining m tuples of the 2m−1 tuples; and
decode the ECC codeword based at least in part on the set of m output tuples.

26. The system of claim 25, wherein the outermost row is a top row of the conceptual matrix and the outermost column is a far-left column of the conceptual matrix, and the iterative decoder is further to:
compute an intermediate set of tuples corresponding to elements of the conceptual matrix other than the 2m−1 tuples that have less than m elements above and to the left in the conceptual matrix.

27. The system of claim 26, wherein the iterative decoder is further to organize tuples in the intermediate set into subsets corresponding to edges within the conceptual matrix, and to merge the subsets with each other and the at least some of the m tuples of the 2m−1 tuples that remain to obtain the set of m tuples provided as output of the elementary check node.

* * * * *

UNITED STATES PATENT AND TRADEMARK OFFICE
CERTIFICATE OF CORRECTION

| | |
|---|---|
| PATENT NO. | : 9,621,187 B2 |
| APPLICATION NO. | : 13/996532 |
| DATED | : April 11, 2017 |
| INVENTOR(S) | : Zion S. Kwok |

It is certified that error appears in the above-identified patent and that said Letters Patent is hereby corrected as shown below:

In the Claims

Column 11
Claim 11, Line 39-40, "…corresponding the…" should read --…corresponding to the…--

Signed and Sealed this
Third Day of July, 2018

Andrei Iancu
*Director of the United States Patent and Trademark Office*